United States Patent
Takamatsu et al.

(10) Patent No.: US 6,551,939 B2
(45) Date of Patent: *Apr. 22, 2003

(54) PLASMA SURFACE TREATMENT METHOD AND RESULTING DEVICE

(75) Inventors: Toshi Takamatsu, Chiba (JP); Shuzo Fujimura, Chiba (JP)

(73) Assignee: Anneal Corporation, Walnut Creek, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/268,203

(22) Filed: Mar. 15, 1999

(65) Prior Publication Data

US 2001/0008803 A1 Jul. 19, 2001

Related U.S. Application Data

(60) Provisional application No. 60/078,321, filed on Mar. 17, 1998.

(51) Int. Cl.[7] .............................................. H01L 21/302
(52) U.S. Cl. ......................... 438/706; 438/710; 438/712
(58) Field of Search ............................... 438/706, 707, 438/710, 711, 712; 156/345, 643, 646, 662; 118/723 I, 723 R

(56) References Cited

U.S. PATENT DOCUMENTS

| | | | | |
|---|---|---|---|---|
| 4,870,245 A | * | 9/1989 | Price et al. | 219/121.36 |
| 5,030,319 A | * | 7/1991 | Nishino et al. | 156/345 |
| 5,505,816 A | * | 4/1996 | Barned et al. | 156/662.1 |
| 5,512,102 A | * | 4/1996 | Yamazaki | 118/723 |
| 5,789,867 A | * | 8/1998 | Westendorp et al. | 315/111.21 |
| 5,907,188 A | * | 5/1999 | Nakajima et al. | 257/751 |
| 6,019,848 A | * | 2/2000 | Frankel et al. | 118/715 |
| 6,149,828 A | * | 11/2000 | Vaasrtra | 216/57 |

FOREIGN PATENT DOCUMENTS

JP 6-338578 12/1994

OTHER PUBLICATIONS

Fujimura et al.,"Study on Ashing Process for Removal of ion Implanted Resist Layer", Process Symposium, Dry Process; Procedure vol. 88–7, Honolulu, Hawaii, May 1987 (The Electro Chemical Society Inc. Pennington, 1988), pp. 126–133.

Fujimura et al., "Resist Stripping in an $O_2+H_2O$ Plasma Downstream", J. Vac. Sci. Technol. B9 (2), Mar./Apr. 1991, pp. 357–361.

Kikuchi et al., "Effects of $H_2O$ on Atomic Hydrogen Generation in Hydrogen Plasma", Jpn. J. Appl. Phys., vol. 32 (1993), Part 1, No. 6B, June 1993, pp. 3120–3124.

(List continued on next page.)

Primary Examiner—Robert Kunemund
Assistant Examiner—Lan Vinh
(74) Attorney, Agent, or Firm—Townsend and Townsend and Crew LLP

(57) ABSTRACT

The present invention provides a method for treating a surface of an object using, for example, a downstream region of a plasma source. The method includes a step of generating a plasma from a gas-C in a plasma source, where the gas-C includes a gas-A and a gas-B. Gas-A is selected from a compound comprising at least a nitrogen bearing compound or an other gas. The other gas is selected from a mixture of an element in group 18 classified in the atomic periodic table. Gas-B includes at least a $NH_3$ bearing compound. The method also includes a step of injecting a gas-D downstream of the plasma source of the gas-C. The method also includes a step of setting an object (having a surface) downstream of the gas-D injection and downstream of the plasma source. A step of processing the surface of the object by a mixture species generated from the gas-C in the plasma and the gas-D is included. The $NH_3$ bearing compound in the gas-C includes a $NH_3$ bearing concentration that is lower than an explosion limit of $NH_3$, which is safer than conventional techniques.

24 Claims, 4 Drawing Sheets

OTHER PUBLICATIONS

Kikuchi et al., "Cleaning of Silicon Surfaces Surfaces by $NF_3$-Added Hydrogen and Water–Vapor Plasma Downstream Treatment", Jpn. J. Appl. Phys., vol. 35 (1996), Part 1, No. 2B, Feb. 1996, pp. 1022–1026.

Kim et al., "Recombination of O, N, and H Atoms on Silica: Kinetics and Mechanism", Langmuir 1991, vol. 7, No. 12, pp. 2999–3005.

Martin, "Diamond Film Growth in a Flowtube: A Temperature Dependence Study", J. Appl. Phys., vol. 70., No. 10, Nov. 15, 1991, pp. 5667–5674.

Papers by S. Fujimura, H. Yano, J. Konno, T. Takada. and K. Inayoshi: Study on aching process for removal ion implanted resist layer, Process Symposium, Dry Process, Procedure vol. 88–7, Honolulu, Hawaii May 1987 (The electro chemical Society Inc. Penninton, 1988) pp. 126–133.

J. Kikuchi et al. Extended Abstracts (The 44th Spring Meeting, 1997); The Japan Society of Applied Physics and Related Societies, 1997.

J. Kikuchi, M. Iga, H. Ogawa, S. Fujimura, and H. Yano: Native oxide removal on Si surface by NF3–added hydrogen and water vapor plasma downstream treatment, Jpn. J. Appl. Phys, 35, 1022–1026 (1996).

J. Vac. Sci Tehnol B, 9, 357–361 (1991).

L. Brown, J.Phys. Chem., 71, 2429 (1967).

Young C. Kim and Michael Boudant, recombination of O, N, and H atoms as Silica:Kinetics and mechanism, hagemuir, 7, 2999–3005 (1991), and L. Robbin Martin, "Diamond film growth in a flowtube: A temperature: A temperature dependance study; J. Appl. Phys., 70, 5667–5674 (1991)".

* cited by examiner

PLASMA SURFACE TREATMENT METHOD AND RESULTING DEVICE

CROSS-REFERENCES TO RELATED APPLICATIONS

This application claims priority to U.S. Ser. No. 60/078,321 filed Mar. 17, 1998, commonly assigned and hereby incorporated by reference for all purposes.

BACKGROUND OF THE INVENTION

The present invention relates to objects and their manufacture. More particularly, the invention is illustrated in an example using a novel combination of gases and a downstream plasma surface for selectively removing photoresist materials for substrates used in semiconductor integrated circuits. Merely by way of example, the invention can be applied in the manufacture of other substrates such as flat panel displays, micro electrical mechanical machines ("MEMS"), sensors, optical devices, and others.

In the manufacture of objects such as integrated circuits, processing safety and reliability have been quite important. Fabrication of integrated circuits generally require numerous processing steps such as etching, deposition, photolithography and others. In the photolithography process, for example, a photoresist film of material is often used to form patterns on thin slices of silicon or films that are deposited on such silicon. After patterning, however, it is necessary to remove the photoresist film from the silicon using a hydrogen bearing compound. Additionally, hydrogen bearing compounds are used in plasma treatment of silicon surfaces. In some cases, hydrogen is used to terminate ends of silicon bonds. Hydrogen is also used to remove oxides. Numerous studies have been made in using a hydrogen bearing compound, and in particular a low temperature process using a reductive reaction from atomic hydrogen produced by a hydrogen gas molecule gas plasma. For example, an object such as a wafer or hard disk has a surface, which is to be processed at a certain area or reactor exposed to high energy species such as ions even in the plasma downstream system. This way of processing occurs because lifetime of atomic hydrogen generated in the plasma is often short and can easily recombine into hydrogen molecules outside of the plasma discharge area. Thus, the conventional process often cannot avoid damage caused by high-energy species such as ions and electrons, decreasing the controllability of processing.

Numerous techniques using hydrogen for processing devices have been reported. As merely an example, a conventional process for ashing organic material, which is carbonized by ion implantation, using atomic hydrogen in a downstream plasma of hydrogen diluted by nitrogen or argon, has been reported by in a paper by S. Fujimura, H. Yano, J. Konno, T. Takada, and K. Inayoshi: Study on ashing process for removal of ion implanted resist layer, Process Symposium, Dry Process, Procedure Vol. 88-7, Honolulu, Hi., May, 1987 (The Electrochemical Society Inc. Pennington, 1988) pp. 126–133, which is incorporated herein by reference herein. It also has been reported that a high concentration atomic hydrogen is obtained in plasma downstream by the use of mixture of hydrogen and water vapor as the source gas for the plasma in J. Kikuchi, S. Fujimura, M. Suzuki, and H. Yano, Effects of $H_2O$ on atomic hydrogen generation in hydrogen plasma, Jpn. J. Appl. Phys., 32, pp. 3120–3124 (1993) ("Kikuchi, et al."), which is incorporated by reference herein. Kikuchi et al. proposes a method to make an environment of a high concentration of atomic hydrogen at a downstream region where the influence of substantially all high energy species such as ions, electrons, and photons generated by plasma discharge can be substantially ignored.

Moreover, it was discovered that silicon native oxide could be eliminated at low temperature using $NF_3$ injected downstream of a $H_2+H_2O$ plasma. This has been reported by J. Kikuchi, M. Iga, H. Ogawa, S. Fujimura, and H. Yano, Native oxide removal on Si surface by NF3-added hydrogen and water vapor plasma downstream treatment, Jpn. J. Appl. Phys., 33, 2207–2211 (1994). This silicon native oxide removal process with $NF_3$-added hydrogen and water vapor plasma downstream treatment achieved a removal of silicon native oxide at nearly room temperature in vacuum environment and formation of hydrogen terminated silicon surface. Thus, the reported process can replace the conventional high temperature hydrogen gas pre-treatment of silicon epitaxy. J. Kikuchi, M. Nagasaka, S. Fujimura, H. Yano, and Y. Horiike, "Cleaning of Silicon Surface by $NF_3$-Added Hydrogen and Water-Vapor Plasma Downstream Treatment," Jpn. J. Appl. Phys., 35, 1022–1026 (1996). Additionally, it was suggested to use this method for the several applications of a silicon based semiconductor-manufacturing process such as cleaning of a contact hole of ULSI devices, J. Kikuchi, M. Suzuki, K. Nagasaka, and S. Fujimura. The silicon native oxide removal with using $NF_3$-added hydrogen and water vapor plasma downstream treatment 4. Extended Abstracts (The 44th Spring Meeting, 1997); The Japan Society of Applied Physics and Related Societies, 1997, (29p-W6) in Japanese.).

The aforementioned technologies generally required introducing a high concentration of a hydrogen gas into a plasma. The high concentration of hydrogen causes an absolute risk of an explosion. Accordingly, a high-level safe system has to be prepared for practical use of this technology. For example, restrictions of the use of rotary vacuum pump with conventional vacuum pump oil should be prepared. A requirement of a vacuum load lock system in order to prevent the leaking of hydrogen from reaction reactor also need be prepared. A further requirement would include a high volume dilution inert gas system at exhaust pump gas in order to reduce the concentration of hydrogen lower than its explosion limit. Moreover, the system would also require a hydrogen gas leak-monitoring system, a fire extinguishing system, and an alarm system for the inside of equipment or installed room itself. These safety requirements will generally result in high costs to use this technology and it will become an obstacle to the growth of the technology in the industry.

From the above, it is seen that an improved technique of fabricating a substrate in an easy, cost effective, and efficient manner is often desirable.

SUMMARY OF THE INVENTION

According to the present invention, a technique including a method and device for the manufacture of treating objects is provided. In an exemplary embodiment, the present invention provides a novel technique for treating a surface of an object using a plasma treatment apparatus.

In a specific embodiment, the present invention provides a method for treating a surface of an object using, for example, a downstream region of a plasma source. The method includes a step of generating a plasma from a gas-C in a plasma source, where the gas-C includes a gas-A and a gas-B. Gas-A is selected from a compound comprising at least a nitrogen bearing compound or an other gas The other gas is selected from a mixture of an element in group 18 classified in the atomic periodic table. Gas-B includes at least a $NH_3$ bearing compound. The method also includes a step of injecting a gas-D downstream of the plasma source of the gas C. The method also includes a step of setting an object (having a surface) downstream of the gas-D injection and downstream of the plasma source. A step of processing the surface of the object by a mixture species generated from the gas-C in the plasma and the gas-D is included. The $NH_3$ bearing compound in the gas-C includes a $NH_3$ bearing concentration that is lower than an explosion limit of $NH_3$, which is safer than conventional techniques.

In a specific embodiment, the present invention provides an apparatus for processing an object. The apparatus includes a chamber and a plasma discharge room coupled to the chamber. A susceptor holds the object, i.e., wafer, display, panel. The plasma discharge room is downstream from the chamber. The apparatus also has a first gas supply comprising a gas A coupled to the plasma discharge room, where the gas A comprises a nitrogen bearing compound. The apparatus also has a second gas supply comprising a gas B coupled to the plasma discharge room, where the gas B comprises an $NH_3$ bearing compound. A third gas supply with a gas D coupled between the plasma discharge room and the chamber also is included. The present apparatus does not generally require load locks or the like, which are often used with conventional hydrogen processing tools.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENTS

Figure 1:
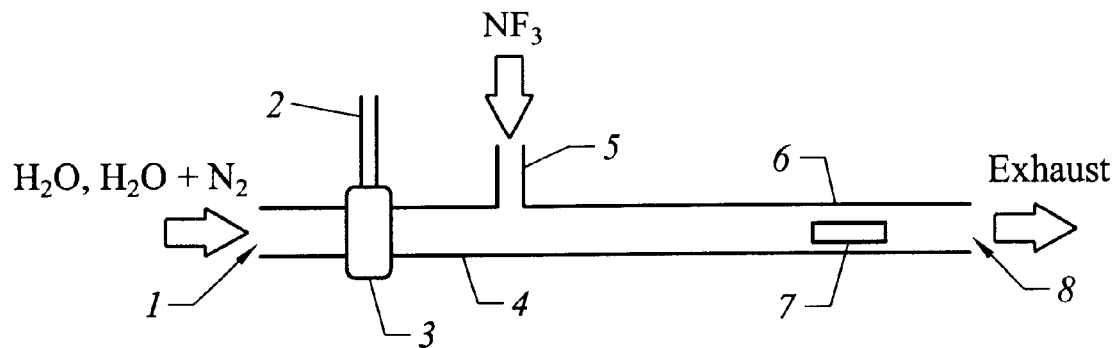
FIG. 1 is a simplified drawing of a system according to an embodiment of the present invention.

According to the present invention, a technique including a method and device for the manufacture of treating objects is provided. In an exemplary embodiment, the present invention provides a novel technique for treating a surface of an object using a plasma treatment apparatus.

In a specific embodiment, the invention relates to a surface material treatment method with use of the plasma producing atomic hydrogen, for example. The invention also relates to a surface treatment method using atomic hydrogen which is produced by a plasma. In an alternative embodiment, the present invention uses a catalytic action of nitrogen, helium, neon, argon, krypton, xenon and/or radon, as well as other elements, as a part of a plasma source gas. The invention also uses a step of applying under a downstream plasma method which has features of being substantially free from physical surface damage. In some of these embodiments, the present invention also reduces or minimizes inappropriate active species for the purpose of treatment, thereby providing a more efficient and effective process. Accordingly, the present invention can provide advantages such as decreased costs and increased safety in surface treatment of a downstream plasma generating atomic hydrogen, for example.

For easier reading, we have prepared the following list of items and their names, which are shown in the FIGS. for referencing or cross-referencing purposes. These names are merely shown for illustration purposes and should not limit the scope of the claims herein. One of ordinary skill in the art would recognize other variations, modifications, and alternatives.

1. #1 Gas inlet
2. Microwave guide
3. Microwave cavity
4. #2 Gas inlet
5. Chamber
6. Treatment room
7. Silicon substrate
8. Exhaust
11. Plasma discharge room
12. Gas-A supply unit
13. Gas-B supply unit
14. Fitting
15. Microwave generator
16. Wave guide
17. Microwave cavity
18. Nozzle
19. Gas-D supply unit
20. Fitting
21. O-ring
22. Treatment room
23. Treatment material
24. Treatment stage
25. SiC heater unit
26. Vacuum Exhaust port
27. Loading & Unloading port
28. Inside wall
31. Quartz reaction tube
32a, 32b. Electrode
33. RF generator
34. Wafer carrier
35. Wafer
36. Cover
37. Aluminum etch tunnel Again, the above list of names are merely shown for illustrative purposes. These names are not intended to limit the scope of the claims herein.

Before proceeding to the details of the embodiments of the present invention, it may be helpful to fully understand some of the additional limitations with conventional processing techniques. As merely an example, in an attempt to solve some of the risks associated with the above hydrogen gas techniques, Japanese Patent published under KOKAI H6-338578, which is based upon the paper above (J. Kikuchi, M. Nagasaka, S. Fujimura, H. Yano, and Y. Horiike, Cleaning of Silicon Surface by $NF_3$-added Hydrogen and Water-Vapor Plasma Downstream Treatment, Jpn. J. Appl. Phys., 35, 1022–1026 (1996).), describes an alternative technique. It has been suggested that the capability of removing silicon native oxide by adding $NF_3$ gas from the down steam region of hydrogen containing gas plasma. The definition of "gas containing hydrogen" claimed in item number 1 and 4 in this official patent report, is not clear, however. The paper indicated an achievement of the objective purpose due to the reaction of atomic hydrogen and $NF_3$.

Taking this in a broad sense, this suggests that a silicon native oxide layer would be removed by injecting $NF_3$ into the downstream of any plasma, which is generated with a gas containing hydrogen atoms as its element and produces atomic hydrogen. Therefore, if the same result of surface treatment in quoted paper is achievable with using $H_2O$ molecule plasma, which is generating atomic hydrogen, issues of safety and economical requirement indicated above, is solved. Additionally, water vapor is indicated, to carry a hydrogen atom described in the above quoted paper.

FIG. 1 shows a plasma down stream process system using a quartz tube similar to the FIG. in the official patent report KOKAI H6-338578. Using this system, for example, a process for trying to etch silicon thermal oxide set at a down flow region of plasma has been performed under these following conditions. (Process time 30 minute, Processing pressure 1 Torr, 30 sccm $H_2O$ as plasma source gas, 50 watt 2.54 GHz microwave as plasma generating source energy, and 5 sccm $NF_3$ added from down flow region of plasma.) A decrease in the thickness of the oxide was not detected in the measurement by ellipsometry. Additionally, the silicon wafer surface with a native oxide did not turn either from hydrophilic to hydrophobic after the treatment. This meant that the native oxide was not removed. The process was tested under different operation conditions with changing pressure from about 0.5 Torr to about 3.0 Torr and changing flow rate of 10 sccm $H_2O$ and 10 sccm $NF_3$. The result showed, however, no evidence of silicon dioxide etching.

Figure 2:
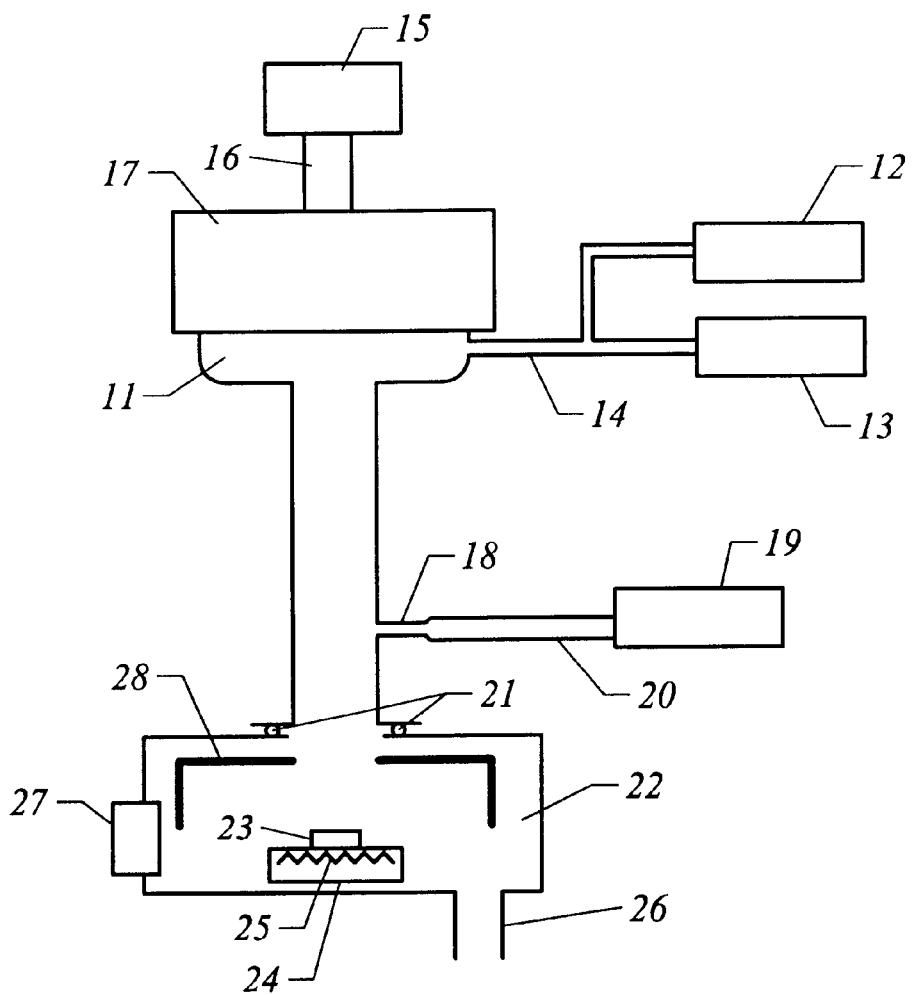
FIG. 2 is a simplified cross-sectional view drawing of an apparatus according to an embodiment of the present invention.

The native oxide was not removed even using the equipment shown in FIG. 2 and got thicker in size to apply to practical treatment, under the following conditions: 100 sccm $H_2O$, 100 sccm $NF_3$, 500 watt 2.54 GHz microwave power, processing pressure 1 Torr; and process time 10 minutes. The result showed there is no evidence of removing native silicon dioxide.

Figure 3:
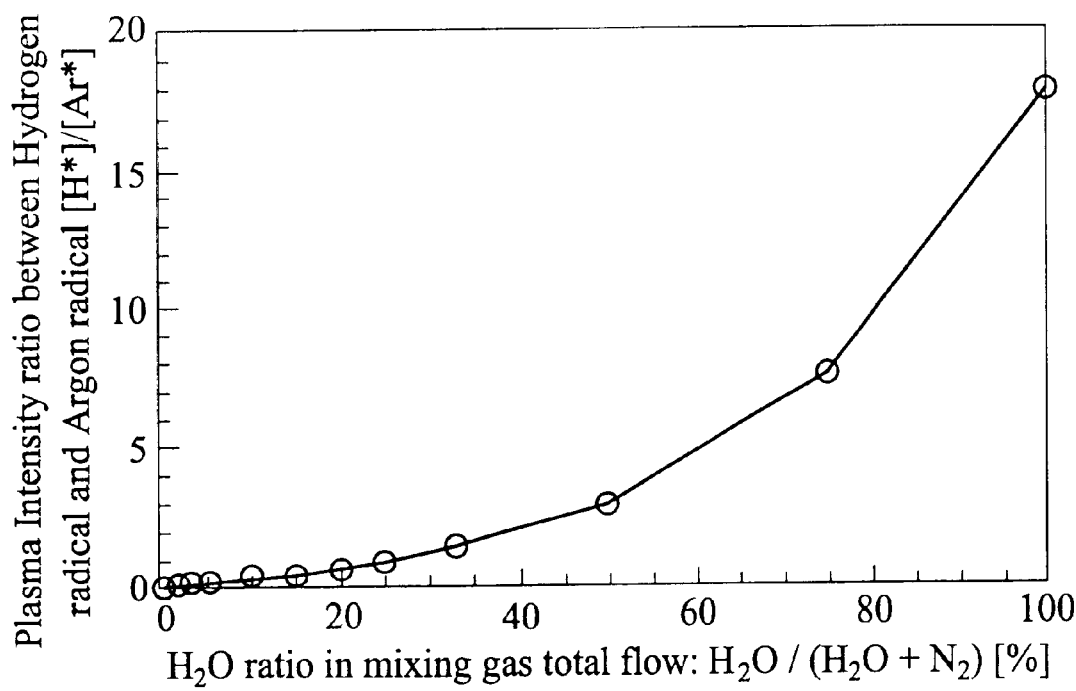
FIG. 3 shows a concentration of atomic hydrogen in a $H_2O+N_2$ gas plasma vs. $H_2O$ ratio of total plasma gas flow according to an embodiment of the present invention.

FIG. 3 shows the dependence of a concentration of atomic hydrogen in a $H_2O+N_2$ gas plasma on an $H_2O$ flow ratio to total gas flow. The concentration of atomic hydrogen in the plasma was measured using a actinometry method. Concrete conditions of the actinometry of atomic hydrogen are described in J.VAC. Sci. Technol. B, 9, 357–361 (1991). The result shows that the highest concentration of atomic hydrogen was observed at 100% $H_2O$ and the concentration of atomic hydrogen decreases with decreasing in $H_2O$ ratio monotonously.

Above experimental results indicate that an etching reaction of silicon dioxide as described in the official patent report KOKAI H6-338578 does not occur in the system with a 100% $H_2O$ plasma and $NF_3$ injection to a downstream region, through atomic hydrogen is surely generated in the plasma. Thus, an altered process with $NF_3$ injection into the downstream of an water vapor plasma as the source of atomic hydrogen does not etch silicon dioxide though the process satisfies the necessary and sufficient condition which is the existence of atomic hydrogen and $NF_3$ and is described in the official patent report KOKAI H6-338578. Therefore, this process could not achieve solving the issues of safety and economical requirement.

In order to solve the above limitations, the relationship between the etch velocity of silicon dioxide and hydrogen atom concentration in downstream area was investigated with the system shown in FIG. 1.

An experiment has been done as follows.

a) Generating a plasma with $H_2O$ and $N_2$ mixed gas with a total gas flow of 30 sccm and 2.54 GHz Microwave of 50 watts.

b) Injecting $NF_3$ of 5 sccm into the downstream of the plasma.

c) Estimating the concentration of atomic hydrogen at 1 Torr by a calorimetry method using a shielded thermocouple, which is covered with quartz except at the tip and inserted into the area where object would be set. The calorimetry method to measure atomic hydrogen flow is described in, for example, "Young C. Kim and Michel Boudart, Recombination of O, N, and H Atoms on Silica: Kinetics and Mechanism, Langmuir, 7, 2999–3005 (1991), and L. Robbin Martin, "Diamond film growth in a flowtube: A Temperature Dependence Study", J. Appl. Phys., 70, 5667–5674 (1991)".

d) Heating a certain place of the tube up to 500 degree Celsius between the $NF_2$ injection point and the point where the object would be set. (Heating increases the reaction rate between atomic hydrogen and $NF_3$ to increase etching velocity. As the result, error in measurement in etching depth is reduced or minimized.)

e) measuring etching depth of the samples treated under several different operation conditions.

Figure 4:
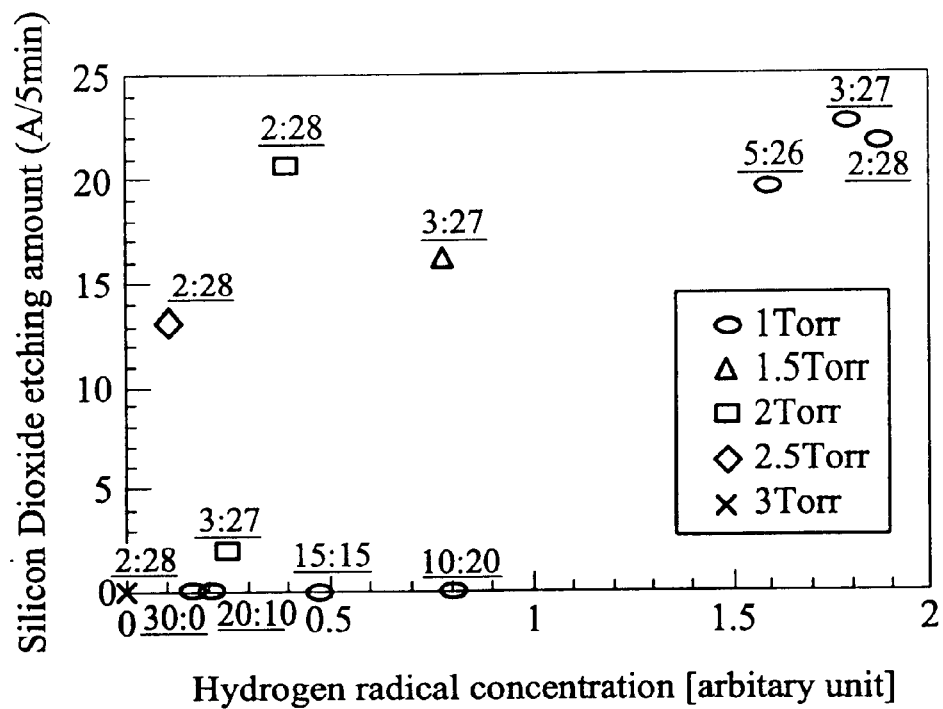
FIG. 4 shows a simplified relation between an etching speed of silicon dioxide and an atomic hydrogen concentration in a downstream area using the system of FIG. 1.

A flow rate of each gas is shown in FIG. 4 near by measurement point. Number on the left side of ":" indicates $H_2O$ flow rate and that on the right side of ":" indicates $N_2$ flow rate. A unit of gas flow is measured in sccm.

In FIG. 4, the concentration of the hydrogen atom is normalized appropriately. From FIG. 4, it is clear that silicon dioxide is not etched in the treatment in 1 Torr with $H_2O$ of relatively high concentration in the $H_2O$ and $N_2$ mixed gas (from 100% to 33% ) though atomic hydrogen exists at the point where the objects have been set. Under the condition of $H_2O$ concentrations lower than 17% ($H_2O$ flow rate is less than 5 sccm), however, silicon dioxide etch was observed and the concentration of atomic hydrogen was also relatively higher than that under the condition with high $H_2O$ mixing ratio.

FIG. 3 shows that the concentration of atomic hydrogen in the plasma increases with the mixing ratio of $H_2O$ ratio in the mixed gas, thus the connection of atomic hydrogen in plasma at the $H_2O$ mixing ratio of 17% is almost 1/20 of that at 100% $H_2O$.

Moreover, the concentration of atomic hydrogen in the plasma at $H_2O$ of 17% where that in the downstream was the highest is about 1/100 of atomic hydrogen concentration in the plasma at 100% $H_2O$. On the other hand, the concentration of hydrogen atom in the downstream at 7% $H_2O$ is almost 13 times as large as that at 100% $H_2O$. These results seem to show that nitrogen generated atomic hydrogen. The disassociation ratio of 100% $H_2O$ gas by 2.54 GHz microwave discharge is the order of ten. See L. Brown, J.Phys. Chem., 71, 2429 (1967). Even taking into consideration of the difference in plasma conditions, a disassociation ratio of $H_2O$ in this experiment would still be several percent. If $H_2O$ can carry atomic hydrogen toward a down flow region without a decrease in the amount of atomic hydrogen independently of operating conditions, the concentration of atomic hydrogen in the downstream would reflect that in the plasma. Thus, the fact that the numerical ratio of atomic hydrogen concentration at the 7% $H_2O$ to that at the 100% changes from 1/100 to 13 with shift in the measurement position from the plasma to the downstream is not convinced, even if nitrogen disassociates water vapor and increases the concentration of atomic hydrogen.

Consequently, it is a reasonable interpretation that the effect of water vapor on atomic hydrogen transportation reported in the paper written by J. Kikuchi, S. Fujimura, M. Suzuki, and H. Yano is effective in the condition with a relatively lower $H_2O$ mixing ratio in plasma source gas and ineffective in the condition with $H_2O$ mixing ratio close to 100%, because hydroxyl radical (OH) and atomic oxygen (O) generated in the plasma quench atomic hydrogen by recombination between them. (When the small amount of $H_2O$ was mixed into $H_2$, OH or O has a higher possibility to collide with a hydrogen molecule instead of atomic hydrogen, then OH and O abstract a hydrogen atom from hydrogen molecules and generate $H_2O$ and OH and one free atomic hydrogen is simultaneously produced. In this result to be produced is a free hydrogen atom from hydrogen molecule.) Therefore, these experiments result that the carrying mechanism of atomic hydrogen from plasma to downstream with mixing nitrogen up to be majority in a $N_2+H_2O$ mixing gas as a plasma source is different from that described in the official patent report KOKAI H6-338578 and some species with catalysis made in the plasma from the nitrogen molecule probably caused the above phenomena that atomic concentration in the downstream at $H_2O$ mixing of several percent was larger than that at 100% $H_2O$.

Experimental results in 1 Torr shown in FIG. 4 seems to also show that higher atomic hydrogen concentration induces larger velocity of silicon dioxide etching. For example, however, silicon oxide was etched by 13 A depth during 5 minutes of treatment under the condition where the treatment pressure was 2 Torr. The flow rate of water vapor and nitrogen was 2 and 28 sccm and not etched under the condition where the treatment pressure was 1 Torr and the flow rate of water vapor and nitrogen was 10 and 20 sccm, though the concentration of atomic hydrogen in the former treatment condition was about 1/8 of that in the latter. In the process performed using a gas mixed with a small amount of water vapor and nitrogen, therefore, the velocity of silicon dioxide etching caused by $NF_3$ injection into the downstream is not always in proportion to the concentration of atomic hydrogen. Taking consideration into the fact that the silicon dioxide etching does not occur depending upon the operating condition in spite of existence of enough amount of atomic hydrogen, this result concludes that silicon dioxide etching in this $H_2O+N_2$ process does not mainly based on the effect of atomic hydrogen and $NF_3$ as shown in the official patent report KOKAI H6-338578 and is caused through some other mechanism.

In FIG. 4, the operation condition giving acceptable etching rate of silicon dioxide distributes in the area showing that the flow rate of nitrogen is far larger than that of water vapor in the mixed gas. It is known that many excited nitrogen molecules with long life-time at a meta-stable energy state of which potential energy is about 10 eV are produced in plasma. The potential energy of these nitrogen molecules is enough to disassociate $H_2O$ and $NF_3$. This suggests that the etching species might be produced by another reaction such as that between $H_2O$ and $NF_2$ instead of the reaction between the hydrogen atom and $NF_3$. In fact, etching did not occur when $N_2$ and $NF_3$ were injected into the downstream of a 100% $H_2O$ plasma, then few exited nitrogen existed in the downstream. Therefore, though the accurate mechanism is not clear, it is seen that the etching using the mixed gas of nitrogen and a little water vapor is mainly caused by the catalytic effect of nitrogen through plasma not caused by the mechanism depending on the reaction between hydrogen atom and $NF_3$ and described in the official patent report KOKAI H6-338578.

If the catalytic effect of nitrogen at meta-stable state makes it possible to use $H_2O$ as the source of the hydrogen atom, other inert gases having long life meta-stable energy state, such as Helium, Neon, Argon, are also available. Actually, the silicon dioxide etching phenomena has been confirmed in the treatment that $NF_3$ was injected into the downstream of a plasma generated using a gas composed by 90% Argon and 10% $H_2O$ as a plasma source gas, though its etching rate was relatively smaller than that using the mixed gas of nitrogen and a few percent of water vapor.

Figure 6:
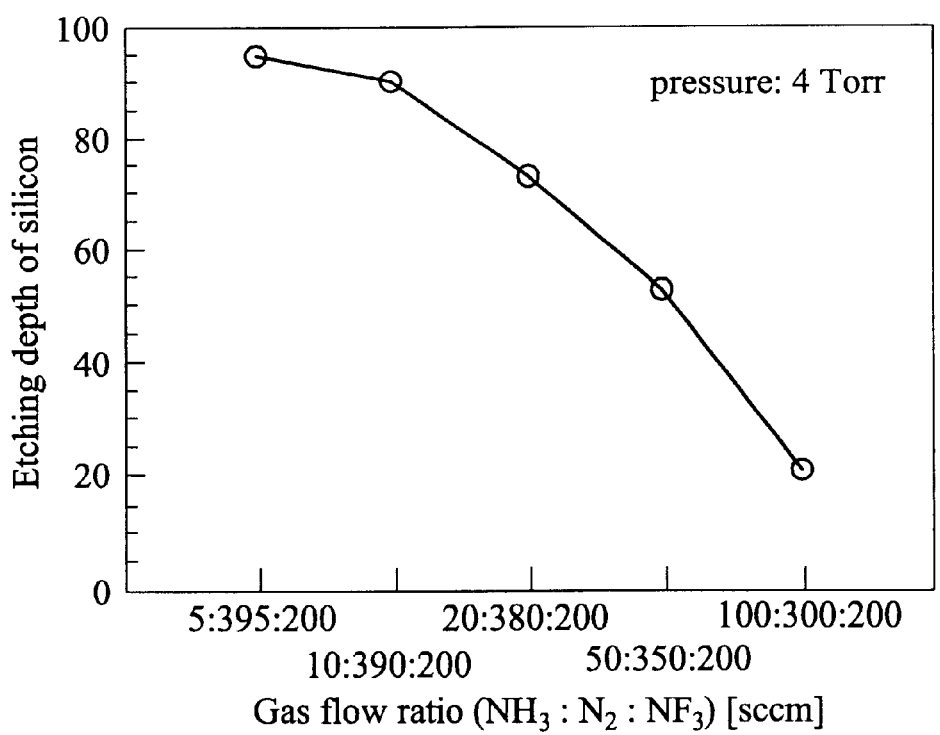
FIG. 6 shows a dependence of etching depth of $SiO_2$ on the mixing ratio of water vapor and nitrogen in a surface treatment using equipment shown in FIG. 2, for example.

This effect suggests that $NH_3$ can be used for this process instead of $H_2O$. NH3 also has risk of explosion. In this process, however, the concentration of the catalytic species can be much larger than that of process species such as water vapor. Namely, for example, nitrogen containing $NH_3$ whose concentration is lower than its explosion limit. Actually, as shown in FIG. 6, lower concentration of $NH_3$ in nitrogen brought higher etching rate. The explosion limit of $NH_3$ in atmosphere is based predominantly on concentration. Taking gas pressure in the vacuum pump and at the exhaust port into consideration, it is preferable to use $NH_3$ at lower concentration than the explosion limit at atmosphere.

FIG. 2 shows the equipment for this invention. As shown is a plasma discharge section 11 for a plasma source gas made of such as quartz or alumina. Reference numeral 12 is the Gas-A supply unit and numeral 13 is the Gas-B supply unit both of which are structured with mass flow controller, valve and filter. Mixed Gas-C, which is mixed with Gas-A provided Gas-A supply unit 12 and Gas-B provided Gas-B supply unit 13, is introduced into plasma discharge room 11 through the fitting-14. Mixed Gas-C introduced into the plasma discharge room-11 is discharged into plasma by microwave, which is supplied to microwave cavity-17 through microwave guide-16 from microwave generator-15. The nozzle 18 to add another gas is set at a suitable point in the downstream region of the plasma discharge area in the plasma discharge room 11. Gas-D is injected into plasma downstream through the fitting-20 from Gas-D supplier unit-19. Gas-D supply unit is structured with mass flow controller, valve and filter. Plasma discharge room 11 is connected with treatment room 22 with O-ring 21. The surface of object 23 which placed inside of the treatment room 22, is processed by the gas which is prepared by discharged Gas-C and injected Gas-D. The object 23 is placed on stage 24 and Si-C heating unit 25 is instrumented at upper section of stage 24 in order to heat up the object 23. The treatment room 22 has vacuum exhaust port 26 and connected to the rotary vacuum pump, which is not showed in this schematic. The treatment room 22 also has the material transport port 27 in order to load and unload the object. Inner wall part 28 can be set inside of treatment room 22 in order to protect the wall side of the treatment room or any other reason.

EXAMPLES

1. First Example

Figure 5:
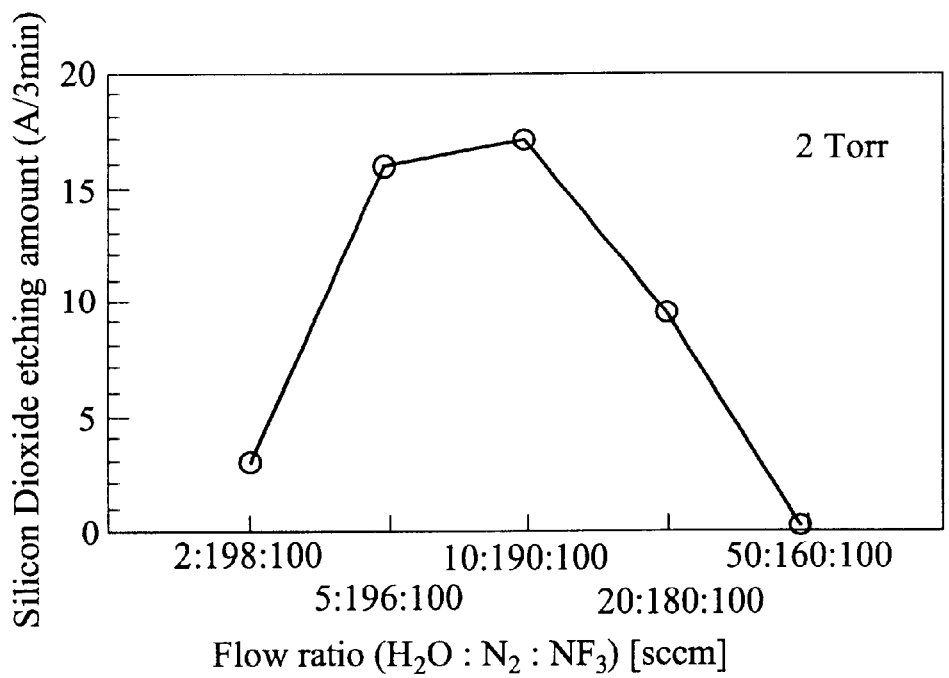
FIG. 5 shows etching depth of $SiO_2$ as a function of gas flow ratio of water-vapor and nitrogen with water-vapor diluted with nitrogen mixed gas plasma due to 500 watt, 2.45 GHz microwave and added $NF_3$ into down flow section under a pressure 2.0 Torr and a processing time of 3 minute.

FIG. 5 shows the dependence of etching depth of $SiO_2$ on the mixing ratio of water-vapor and nitrogen in the surface treatment using the equipment shown in FIG. 2. In this treatment, $NF_3$ of 100 sccm was injected into the downstream of $N_2+H_2O$ plasmas discharged by 2.45 GHz microwave of 500 W and 6 inch silicon wafers covered by silicon dioxide as etching sample were placed in the downstream of the $NF_3$ injected point. The maximum etching rate was obtained in the treatment with 5% water vapor but no etching occurred in the treatment with higher water vapor mixing ratio than 25%.

In addition, native oxide removal was confirmed by the result that the hydrophilic surface of a 6 inch Si wafer covered by native oxide was turned to hydrophobic after 3 minutes of downstream treatment. Then microwave power was 500 W, pressure was 2.0 Torr, flow rate of $NF_3$ was 100 sccm, and flow rate of water vapor and nitrogen was 10 sccm and 190 sccm.

2. Second Example

FIG. 6 shows dependence of etching depth of $SiO_2$ on the mixing ratio of water vapor and nitrogen in the surface treatment using the equipment shown in FIG. 2, for example. In this treatment, $NF_3$ of 100 sccm was injected into the downstream region of $N_2+NH_3$ plasmas discharged by 2.45 GHz microwave of 500 W and 6 inch silicon wafers covered by silicon dioxide as etching sample were placed in the downstream of the $NF_3$ injected point. Nitrogen gas containing lower concentration of $NH_3$ than a selected percentage based upon FIG. 6. served good etching result.

Additionally, native oxide removal was also confirmed by the result that the hydrophilic surface of a 6-inch silicon wafer covered by native oxide was turned to hydrophobic after 3-min downstream treatment. Then microwave power was 500 W, pressure was 4.0 Torr, and flow rates of $NF_3$, $NH_3$, and nitrogen are shown in FIG. 6.

3. Third Example

Silicon substrate placed on the treatment heat stage in the equipment shown in FIG. 2 is processed in downstream of a nitrogen plasma with 5% of water-vapor (10 sccm). Flow rate of nitrogen containing 5% of water vapor was total 200 sccm. Applied microwave (2.45 GHz) was 500 W to generate plasma. In this treatment, silane gas of 5 sccm was injected at the downstream. Substrate temperature was kept at 450 degree C. during processing and treatment time was 1 hour under pressure at 2 Torr. By the processing, certain deposited film was formed on the silicon wafer surface and the surface of the film was hydrophilic.

After dipping this sample into 5% of HF diluted solution for 1 minute, the silicon surface became the hydrophobic. This indicates that the deposited material must be some kind of silicon-oxide-material.

4. Fourth Example

Silicon substrate placed on the treatment heat stage in the equipment shown in FIG. 2 is processed in downstream of a nitrogen plasma with 5% of water-vapor (10 sccm). Flow rate of nitrogen containing 5% of water vapor was total 200 sccm. Applied microwave (2.45 GHz) was 500 W to generate plasma. In this treatment, ethyl alcohol of 5 sccm was injected at the downstream. Substrate temperature was kept at 600 degree C. during processing and treatment time was 3 hr. By this treatment, silicon wafer surface was discolored by a deposited film. In order to probe what this deposited material was, the sample was treated with plasma ashing system.

Figure 7:
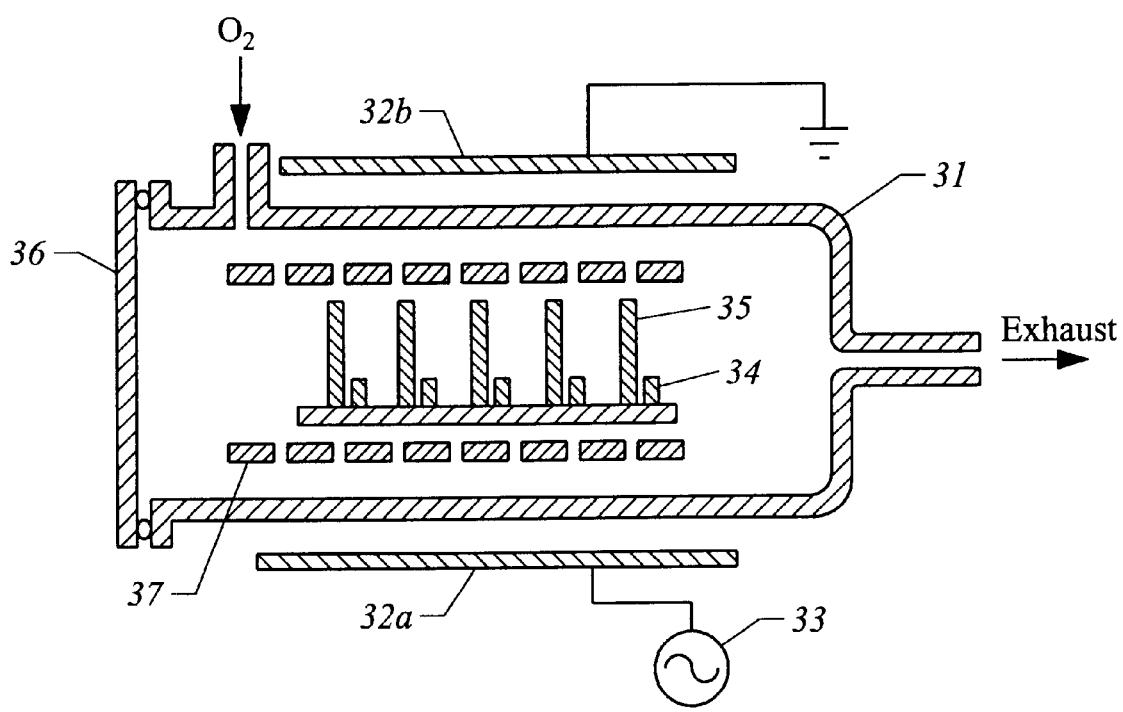
FIG. 7 is a simplified cross-sectional view diagram of a barrel type plasma ashing system according to an embodiment of the present invention.

FIG. 7 shows the barrel type plasma ashing system is used to process wafer 35 on the wafer carrier 34 by oxygen plasma which is generated inside of quartz reaction tube 31 induced oxygen and supplied RF power into the electrode 32a and 32b from RF generator 33. Wafer 35 is load and unload at the part of open side of quarts tube 31, and use cover 36 at the processing time to cover quartz open side. Aluminum etch tunnel 37 is also available. Previous processed Si wafer with a deposition film was processed with this type of oxygen ashing system under conditions of oxygen gas flow 500 sccm, 1 Torr and 300 watt RF power for 30 minutes. This processing stripped previously observed deposited material. This is the indication that previous deposit material should be some type of carbon content material such as amorphous carbon or diamond like carbon. The result shows that this method can be used to produce carbon composite material film include diamond.

As above description, surface treatment in which atomic hydrogen was the one of the necessary species is realized by the use of a gas mixed a gas containing essentially water vapor and a gas containing nitrogen, helium (He), neon (Ne), argon (Ar), krypton (Kr), xenon (Xe) and/or radon (Rn), through the catalytic effect induced on nitrogen, helium (He), neon (Ne), argon (Ar), krypton (Kr), xenon (Xe) and/or radon (Rn) by the plasma, though water vapor was used for the source of atomic hydrogen. Accordingly, this invention makes it possible to inexpensively and safely use the atomic hydrogen surface treatment without special safety protection system and circumstance.

For example, in comparison with conventional water vapor added hydrogen plasma system, this technology can substantially eliminate the load lock module, object transfer system specialized to load lock environment, pumping package applicable to hydrogen evacuation, exhaust gas treatment system, safety and alert system, and other hardware. Thus, this invention provides the cost reduction of this system over 10,000,000 yen per unit (in 1998) depending on the purpose of system and the condition of operation.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of treating an object, the method comprising:
   positioning the object to be treated using an etching process in a process chamber;
   generating a plasma from a gas mixture comprising a first gas, the first gas being selected from the group consisting of a nitrogen bearing compound and an element in group 18 of the atomic periodic table, and a second gas, comprising an $NH_3$ bearing compound;
   passing the plasma along a conduit after the plasma has been generated;
   injecting a third gas into the conduit to form a mixture species from the plasma and the third gas; and
   passing the mixture species from the conduit into the process chamber away from where the plasma has been generated so as to etch the object in the process chamber with the mixture species, whereupon the object is substantially free from physical surface damage;
   wherein the $NH_3$ is provided at a concentration below an explosion limit defined at 1 atmosphere pressure.

2. The method of claim 1 wherein said object is a semiconductor wafer having a layer of oxide and the method comprises substantially maintaining the layer of oxide on the semiconductor wafer.

3. The method of claim 1 wherein said mixture species comprises atomic hydrogen.

4. The method of claim 1 wherein said method occurs in an apparatus not having a load lock module.

5. The method of claim 1 wherein the gas comprising an element in group 18 of the atomic periodic table is selected from the group consisting of helium, neon, argon, krypton, xenon, and radon.

6. The method of claim 1 wherein the compound comprising a nitrogen bearing compound is selected from the group consisting of $N_2$ and $NF_3$.

7. The method of claim 1 wherein said plasma is generated by a microwave source.

8. The method of claim 1 wherein said plasma is generated in a microwave cavity.

9. The method of claim 1 which further comprises increasing a temperature of the mixture species to up to 500 degrees Celsius.

10. A method of treating an object, the method comprising:
    positioning the object to be treated including etching in a treatment room;
    generating a plasma in a plasma discharge room from a gas A the gas A comprising a nitrogen bearing compound, and a gas-B, the gas B comprising $NH_3$;
    passing the plasma from the plasma discharge room to the treatment room;
    injecting a gas D into the plasma at a location between the plasma discharge room and the treatment room through a nozzle so as to form a mixture of said plasma and said gas D; and
    introducing the mixture into the treatment room so as to etch the object in the treatment room with a mixture species generated from the plasma and said gas D, whereupon the object is substantially free from physical surface damage;
    wherein the $NH_3$ is provided at a concentration below an explosion limit defined at 1 atmosphere pressure.

11. The method of claim 10 wherein said gas D is selected from the group consisting of silane, alcohol, and $NF_3$.

12. The method of claim 10 wherein said mixture species comprises atomic hydrogen.

13. The method of claim 10 wherein said method occurs in an apparatus not having a load lock module.

14. The method of claim 10 wherein said nitrogen bearing compound is selected from the group consisting of $N_2$ and $NF_3$.

15. The method of claim 10 wherein said plasma is generated by a microwave source.

16. The method of claim 10 wherein said plasma is generated in a microwave cavity.

17. The method of claim 10 further comprising increasing a temperature of the mixture species to up to 500 degrees Celsius.

18. A method of treating an object, the method comprising:
    positioning the object to be treated using an etching process in a process chamber, the object including an overlying thin layer of silicon dioxide overlying a surface on the object;
    generating a plasma from a gas mixture comprising a first gas, the first gas being selected from the group consisting of a nitrogen bearing compound and at least an element in group 18 of the atomic periodic table, and a second gas, the second gas comprising an $NH_3$ bearing compound;
    passing the plasma along a conduit after the plasma has been generated;
    injecting a third gas into the conduit to form a mixture species from the plasma and the third gas;
    passing the mixture species from the conduit into the process chamber away from where the plasma has been generated;
    applying atomic hydrogen in the mixture species to the surface of the object to process the surface of the object;
    removing the thin surface of silicon dioxide from the surface of the object with the mixture species including the atomic hydrogen, whereupon the surface of the object is substantially free from physical surface damage;
    wherein the $NH_3$ is provided at a concentration below an explosion limit defined at 1 atmosphere pressure.

19. The method of claim 18 wherein said method occurs in an apparatus not having a load lock module.

20. The method of claim 18 wherein the gas comprising an element in group 18 of the atomic periodic table is selected from the group consisting of helium, neon, argon, krypton, xenon, and radon.

21. The method of claim 18 wherein the compound comprising a nitrogen bearing compound is selected from the group consisting of $N_2$ and $NF_3$.

22. The method of claim 18 wherein said plasma is generated by a microwave source.

23. The method of claim 18 wherein said plasma is generated in a microwave cavity.

24. The method of claim 18 which further comprises increasing a temperature of the mixture species to up to 500 degrees Celsius.

* * * * *